(12) United States Patent
Carlino et al.

(10) Patent No.: US 7,307,504 B1
(45) Date of Patent: Dec. 11, 2007

(54) CURRENT TRANSFORMER, CIRCUIT INTERRUPTER INCLUDING THE SAME, AND METHOD OF MANUFACTURING THE SAME

(75) Inventors: Harry J. Carlino, Export, PA (US); James L. Lagree, Robinson Township, PA (US); Todd M. Shaak, Presto, PA (US)

(73) Assignee: Eaton Corporation, Cleveland, OH (US)

( * ) Notice: Subject to any disclaimer, the term of this patent is extended or adjusted under 35 U.S.C. 154(b) by 0 days.

(21) Appl. No.: 11/624,721

(22) Filed: Jan. 19, 2007

(51) Int. Cl.
*H01F 17/06* (2006.01)
*H01F 7/06* (2006.01)

(52) U.S. Cl. .................... 336/213; 336/178; 29/602.1

(58) Field of Classification Search ............. 336/178, 336/213, 216, 217, 229; 29/602.1, 605, 606
See application file for complete search history.

(56) References Cited

U.S. PATENT DOCUMENTS 6,144,279 A * 11/2000 Collins et al. ............. 336/178
6,459,349 B1    10/2002 Giday et al.
6,512,438 B1 *  1/2003 Yoshimori et al. ......... 336/178
6,992,555 B2 *  1/2006 Hasegawa et al. ......... 336/178
7,002,440 B2    2/2006 Attarian et al.

\* cited by examiner

*Primary Examiner*—Anh Maj
(74) *Attorney, Agent, or Firm*—Martin J. Moran

(57) ABSTRACT

A current transformer includes a CT core having a central opening, a height, a width, inner and outer radii, and a secondary winding disposed about the CT core. The CT core is formed from a winding of an elongated length of taped steel having a reluctance and a width. The CT core height corresponds to the taped steel width. The CT core width is equal to the difference between the outer and inner radii. An air gap having a reluctance, a width and a depth is disposed in the CT core. The depth is along a portion of the CT core height. The air gap width is substantially smaller than the CT core height and width. The air gap reluctance is substantially greater than the taped steel reluctance. The CT core has a permeability resulting from being annealed at a temperature of 1450 to 1550° F. for one hour.

22 Claims, 5 Drawing Sheets

CURRENT TRANSFORMER, CIRCUIT INTERRUPTER INCLUDING THE SAME, AND METHOD OF MANUFACTURING THE SAME

BACKGROUND OF THE INVENTION

1. Field of the Invention

This invention pertains generally to circuit interrupters and, more particularly, to circuit interrupters including a number of current transformers. The invention also relates to current transformers. The invention further relates to methods of manufacturing current transformers.

2. Background Information

Molded case circuit breakers (MCCBs) employ current transformers (CTs) to sense primary currents and to supply power to an electronic trip unit. Currents are sensed and the resulting sensed current values are typically used in two modes. In a normal mode, the range of current values is used to calculate trip times having intentional delays. In an override mode, the current values are higher than the normal mode current range and the corresponding trip time is instantaneous. The override mode is responsible for clearing relatively high current faults in the shortest possible time with no intentional delay. In order to be able to properly respond to a high current alternating current (AC) fault, the fault current must be sensed during its first half-cycle. However, known CTs cannot sense current accurately during this first half-cycle due to transformer core design limitations.

One of these limitations is the inability of the CT core to handle extreme changes in magnetic flux. The CT core is constructed of ferromagnetic materials, which tend to "saturate" at a predetermined level that is dictated by, for example, the core material and the core dimensions. The saturation point is where any further increase in magnetizing field force (H) does not result in a proportional increase in magnetic flux density (B) or any more increase in the secondary current resulting from this magnetic flux change. Consequently, the CT secondary waveform is highly distorted and of relatively low magnitude.

The first AC half-cycle of the CT output is dependent on the polarity of the previous AC half-cycle. Referring to FIG. 1, if the previous AC half-cycle was positive when the magnetizing field force (H) was removed, then the CT core will retain a residual or remanent magnetization referred to as +Br. The magnitude of +Br is dependent on the magnetizing field force (+H) and the type of core material.

If the next AC half-cycle is negative, then the magnetic flux density (B) can swing from approximately +Br to −Bmax depending on the magnitude of the corresponding magnetizing field force (−H). This swing will cause a relatively large ΔB (i.e., +Br−(−Bmax)=+Br+Bmax) and, therefore, a relatively large ΔI in the CT secondary current. However, if the next AC half-cycle is positive, then the magnetic flux density (B) can only swing from +Br to +Bmax. In known MCCBs, this will be a relatively small change in flux and, therefore, a resulting relatively small change in CT secondary current. Also, the CT core will reach saturation much faster now since Br is closer to +Bmax. In other words, ΔB will be much smaller in this case (i.e., +Bmax−(+Br)=+Bmax−Br) and the resulting secondary current also will be smaller in magnitude.

Accordingly, there is room for improvement in circuit interrupters.

There is also room for improvement in current transformers.

There is further room for improvement in methods of manufacturing current transformers.

SUMMARY OF THE INVENTION

These needs and others are met by embodiments of the invention, which provide a current transformer core that is structured to have an increased permeability resulting from being annealed at a temperature of about 1450° F. to about 1550° F. for at least about one hour.

In accordance with one aspect of the invention, a current transformer comprises: a generally circular cylindrical current transformer core having a central opening, a height, a width, an inner radius and an outer radius; and a secondary winding disposed about the generally circular cylindrical current transformer core, wherein the generally circular cylindrical current transformer core is formed from a winding of an elongated length of taped steel having a reluctance and a width, wherein the height of the generally circular cylindrical current transformer core corresponds to the width of the elongated length of taped steel, wherein the width of the generally circular cylindrical current transformer core is equal to the difference between the outer radius and the inner radius, wherein an air gap having a reluctance, a width and a depth is disposed in the generally circular cylindrical current transformer core, wherein the depth is along a portion of the height of the generally circular cylindrical current transformer core, wherein the width of the air gap is substantially smaller than both of the height and the width of the generally circular cylindrical current transformer core, wherein the reluctance of the air gap is substantially greater than the reluctance of the taped steel of the generally circular cylindrical current transformer core, and wherein the generally circular cylindrical current transformer core is structured to have a permeability resulting from being annealed at a temperature of about 1450° F. to about 1550° F. for at least about one hour.

The current transformer has a maximum magnetic flux density of at least about 17 kG, a residual or remanent magnetization, a change in magnetic flux density value equal to the maximum magnetic flux density less the residual or remanent magnetization of at least about 10 kG, and the permeability of at least about 2000 N/A$^2$ (H/M).

As another aspect of the invention, a circuit interrupter comprises: separable contacts; an operating mechanism structured to open and close the separable contacts; a current sensor structured to sense current flowing through the separable contacts; a trip unit cooperating with the current sensor and the operating mechanism to trip open the separable contacts; and a power supply cooperating with the current sensor to power the trip unit, wherein the current sensor comprises: a generally circular cylindrical current transformer core having a central opening, a height, a width, an inner radius and an outer radius, and a secondary winding disposed about the generally circular cylindrical current transformer core, wherein the generally circular cylindrical current transformer core is formed from a winding of an elongated length of taped steel having a reluctance and a width, wherein the height of the generally circular cylindrical current transformer core corresponds to the width of the elongated length of taped steel, wherein the width of the generally circular cylindrical current transformer core is equal to the difference between the outer radius and the inner radius, wherein an air gap having a reluctance, a width and a depth is disposed in the generally circular cylindrical current transformer core, wherein the depth is along a portion of the height of the generally circular cylindrical current transformer core, wherein the width of the air gap is substantially smaller than both of the height and the width of the generally circular cylindrical current transformer core, wherein the reluctance of the air gap is substantially greater than the reluctance of the taped steel of the generally circular cylindrical current transformer core, and wherein the generally circular cylindrical current transformer core is structured to have a permeability resulting from being annealed at a temperature of about 1450° F. to about 1550° F. for at least about one hour.

The sensed current may have both a positive half-cycle and a negative half-cycle; and the change in magnetic flux density value may be regardless whether the sensed current occurred on the positive half-cycle or the negative half-cycle.

The sensed current may be an alternating current having a positive half-cycle and a negative half-cycle; and the trip unit and the current sensor may be structured to trip open the separable contacts in less than one of the positive half-cycle and the negative half-cycle.

As another aspect of the invention, a method of manufacturing a current transformer comprises: winding a plurality of layers of an elongated length of taped steel having a reluctance and a width; forming a generally circular cylindrical current transformer core having a central opening, a height, a width, an inner radius and an outer radius from the winding of the elongated length of taped steel; employing the height of the generally circular cylindrical current transformer core corresponding to the width of the elongated length of taped steel; employing the width of the generally circular cylindrical current transformer core as being equal to the difference between the outer radius and the inner radius; forming an air gap having a reluctance, a width and a depth in the generally circular cylindrical current transformer core; employing the depth along a portion of the height of the generally circular cylindrical current transformer core; employing the width of the air gap being substantially smaller than both of the height and the width of the generally circular cylindrical current transformer core; employing the reluctance of the air gap being substantially greater than the reluctance of the taped steel of the generally circular cylindrical current transformer core; and after the winding, annealing the generally circular cylindrical current transformer core at a temperature of about 1450° F. to about 1550° F. for at least about one hour.

The method may further comprise employing the current transformer having a maximum magnetic flux density of at least about 17 kG; employing the current transformer having a residual or remanent magnetization; employing the current transformer having a change in magnetic flux density value equal to the maximum magnetic flux density less the residual or remanent magnetization of at least about 10 kG; and employing the current transformer having a permeability of at least about 2000 N/A$^2$ (H/M).

The method may further comprise increasing the permeability of the generally circular cylindrical current transformer core from the annealing.

The method may employ the current transformer having a first maximum magnetic flux density prior to the annealing and a second maximum magnetic flux density after the annealing, the second maximum magnetic flux density being greater than the first maximum magnetic flux density by about 20%.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENTS

The invention is described in association with a three-phase circuit interrupter, although the invention is applicable to a wide range of circuit interrupters having any number of poles.

As employed herein, the term "number" shall mean one or an integer greater than one (i.e., a plurality).

As employed herein, the term "taped steel" means a structure made of steel having an external insulator (e.g., without limitation, insulative electrical tape; an insulator made of Kapton®; any suitable insulator; any suitable material that withstands 2400 volts in order to pass dielectric breakdown tests).

As employed herein, the term "steel" means any suitable ferromagnetic material (e.g., without limitation, silicon steel; other suitable alloys).

As employed herein, the term "generally circular" means any structure that has a circular or approximately circular component, such as a cylindrical current transformer core having a surface traced by a straight line moving parallel to a fixed straight line and intersecting a fixed planar closed circle or approximately circular curve.

Figure 1:
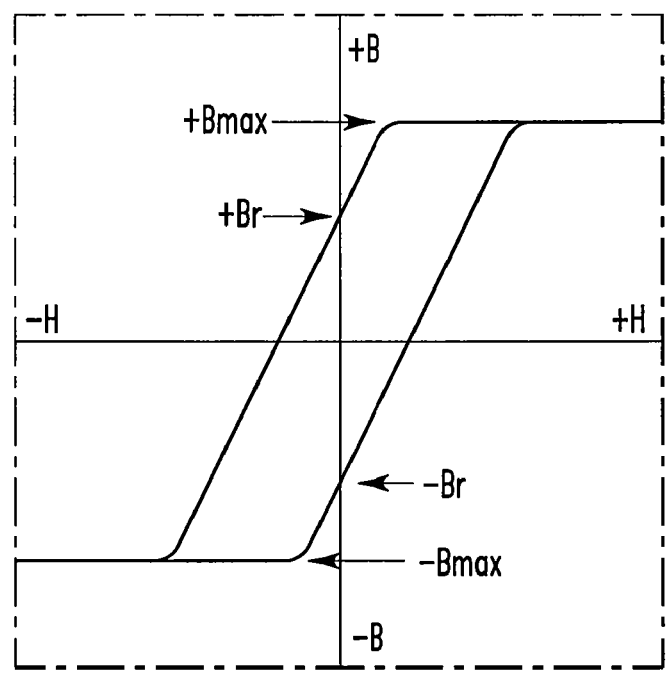
FIG. 1 is a plot of magnetizing force (H) and magnetic flux density (B) including residual or remanent magnetization (Br) of a current transformer core.
Figure 2:
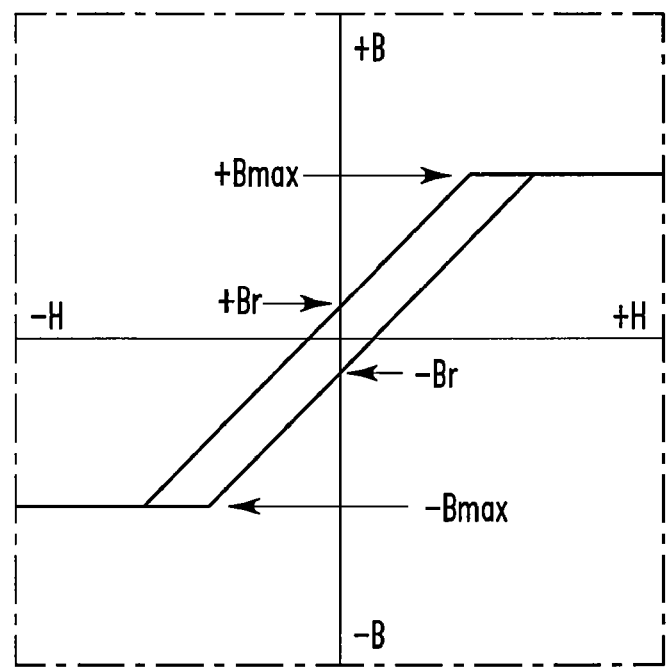
FIG. 2 is a plot of magnetizing force (H) and magnetic flux density (B) including residual or remanent magnetization (Br) of another current transformer core.
Figure 3:
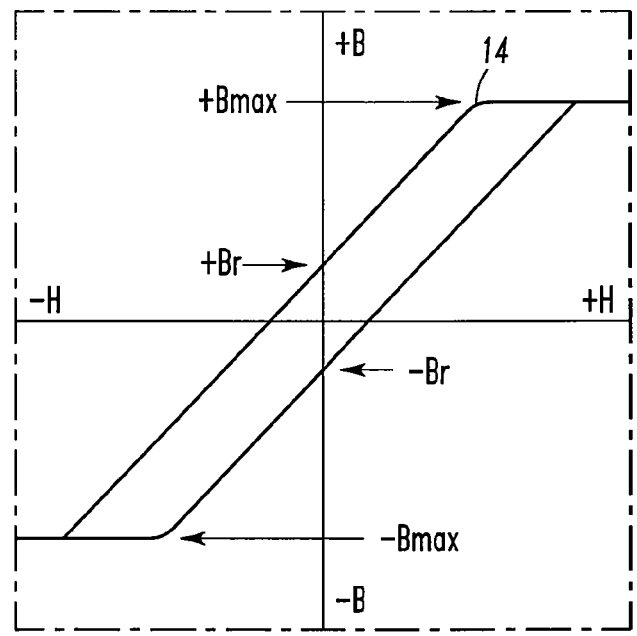
FIG. 3 is a plot of magnetizing force (H) and magnetic flux density (B) including residual or remanent magnetization (Br) of a current transformer core in accordance with an embodiment of the invention.
Figure 4:
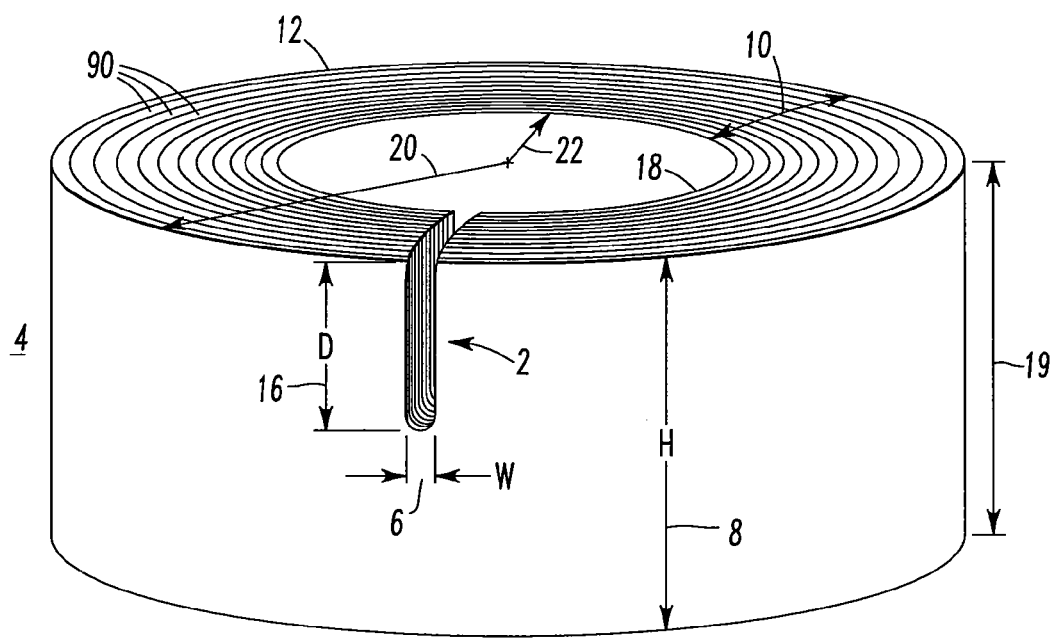
FIG. 4 is an isometric view of a current transformer coil in accordance with another embodiment of the invention.
Figure 7:
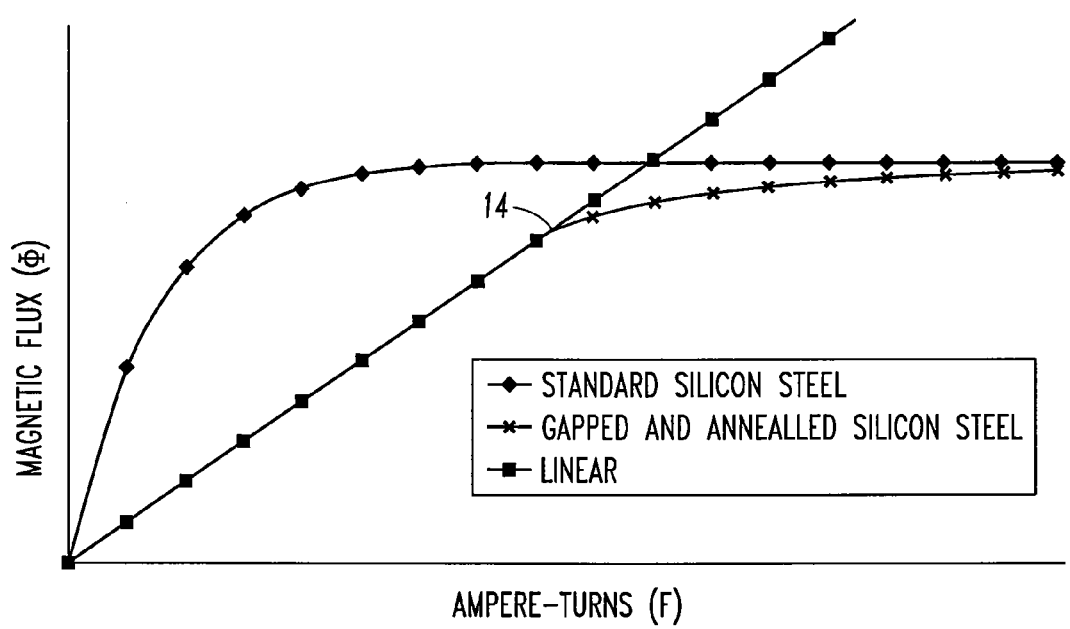
FIG. 7 is a plot of magnetic flux versus ampere-turns for the current transformer coil of FIG. 4.

Referring to FIGS. 2-4, in order to achieve a relatively large ΔB regardless of the positive or negative polarity of the previous alternating current (AC) line half-cycle (i.e., ΔB≧+Bmax−Br), an air gap 2 is introduced into a CT core 4. The air gap 2 is suitably adjusted in order that its width (W) 6 is relatively small compared to the cross-sectional dimensions of the core height (H) 8 and the dimension 10 of the CT core 4. Satisfying this condition prevents serious fringing effects. The gap width 6 is also suitably wide, in order to appreciably increase the reluctance of the series magnetic circuit. This ensures that the air gap 2 would otherwise require many more ampere-turns than the steel part 12 of the series magnetic circuit, in order to saturate. In other words, the reluctance of the air gap 2 is much greater than the reluctance of the steel part 12 of the CT core 4. This causes the magnetization curve to be more linear than it would be without the air gap 2. This holds true as long as the magnetic flux (φ) of the steel CT core 4 is below the knee 14 (FIG. 7). The depth (D) 16 of the gapping also affects ΔB, as well as the permeability. Although deeper gapping increases ΔB, it also decreases permeability.

A relatively large permeability is needed to support the power supply function of the CT core 4. In order to improve the saturation point, the permeability of the CT core 4 is preferably increased through high temperature annealing at relatively high temperatures as will be explained. This process improves Bmax of the CT core 4 by about 20%. Since the resulting magnetization curve of FIG. 3 is less steep and more linear, Br (remanence) is relatively small and ΔB (+Bmax−Br), regardless of the polarity of the previous AC line half-cycle, is relatively very large.

The generally circular cylindrical CT core 4 of FIG. 4 is formed from a winding of an elongated length of taped steel 18 having a reluctance and a width 19. The height 8 of the CT core 4 corresponds to the width 19 of the elongated length of taped steel 18. The width 10 of the CT core 4 is equal to the difference between outer radius 20 and inner radius 22. The air gap 2 has a reluctance, the width 6 and the depth 16 disposed in the CT core 4. The depth 16 is along a portion of the height 8 of the CT core 4. The air gap width 6 is substantially smaller than both of the height 8 and the width 10 of the CT core 4. The air gap reluctance is substantially greater than the reluctance of the taped steel 18 of the CT core 4. After the taped steel 18 is wound, the CT core 4 is advantageously structured to have a permeability resulting from being annealed at a temperature of about 1450° F. to about 1550° F. for at least about one hour. This temperature range avoids 1600° F., at which the crystalline structure of the silicon steel begins to change. Hence, stress relief should always be below that temperature. Known annealing of silicon steel is believed to be performed at about 1200° F. to about 1300° F. This temperature range is insufficient to provide stress relief for the example CT core 4.

EXAMPLE 1

The magnetic properties of electrical steels are especially sensitive to stress. Stresses that produce plastic deformation cause the greatest changes in the magnetic properties of the material being processed. These changes occur because the metal crystals in the stressed metal have been distorted. This distortion of the crystal structure affects the relationship between the magnetizing force and induction. In order to remove the stresses caused by plastic deformation, annealing is required to return the material to a stress-free condition. Accordingly, CT core 4 should be annealed in its final form. This means that all processes that caused the stresses, including, for example, core winding and gapping have been completed. The finished CT core 4 should be stress annealed at temperatures between about 1450° F. to about 1550° F. for at least about one hour. This stress annealing ensures recrystallization of the core material and restoration of the desired magnetic properties.

EXAMPLE 2

Figure 5:
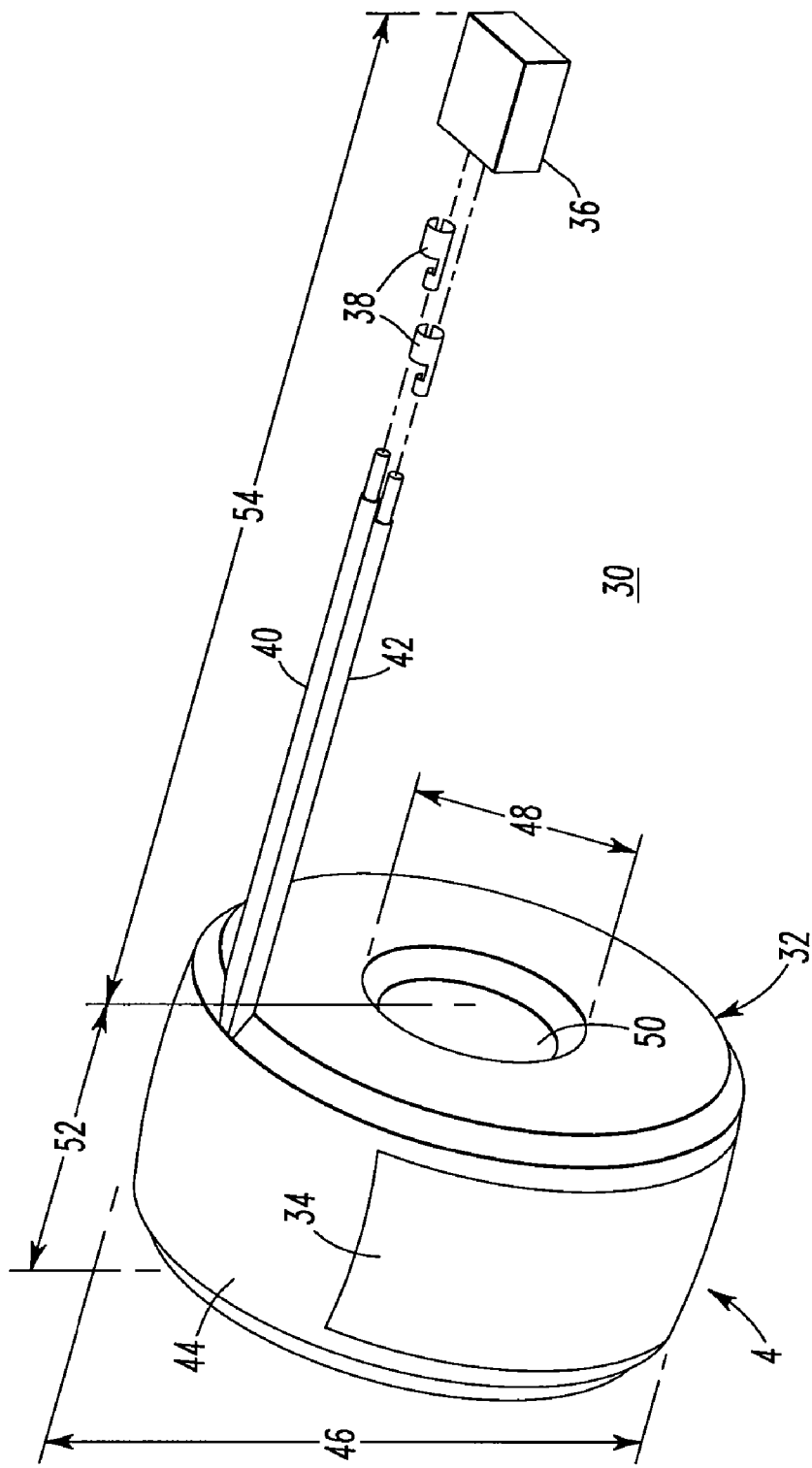
FIG. 5 is a partially exploded isometric view of a current transformer in accordance with another embodiment of the invention.

FIG. 5 shows a current transformer 30 including the CT core 4 of FIG. 4 and a secondary winding 32 (e.g., without limitation, structured for about a 225 A primary current; any suitable primary current). The current transformer 30 further includes a label 34 (e.g., without limitation, showing part number and date code information), a connector housing 36, two connector pins 38, and two insulated conductors 40,42, which exit the secondary winding 32 of the current transformer 30. The secondary winding 32 is disposed about the CT core 4. A suitable insulating tape 44 (e.g., without limitation, Kapton®) covers the secondary winding 32.

In this example, the wire size of the secondary winding 32 of the current transformer 30 is 35 AWG and has 3,750 turns with a resistance of about 177.7 ohms. The outside diameter 46 of the current transformer 30 is about 1.1 inches, the diameter 48 of the central opening 50 of the current transformer 30 is about 0.28 inch, the height 52 of the current transformer 30 is about 0.61 inch, and the length 54 of the conductors 40,42 is about 1.875 inches, although any suitable dimensions may be employed. The dimensions of the CT core 4 include outside diameter of 0.95 inch, central opening diameter of 0.5 inch, height of 0.4 inch, height of air gap 2 of 0.2 inch, and width 6 of air gap 2 of 0.03 inch.

If the width 6 of the air gap 2 (FIG. 4) is $w_{gap}$ and if the cross sectional dimensions of the air gap are "a" (depth) and "b" (height), then the air gap area (that will provide minimal fringing) is shown by Equation 1:

$$AREA_{gap} = (a + w_{gap})*(b + w_{gap}) \quad \text{(Eq. 1)}$$

In Equation 1, the air gap width is added to both the depth and height of the air gap 2 in order to minimize the error caused by fringing effects.

Using the above example dimensions for the CT core 4, the air gap depth a=(0.95−0.5)/2=0.225 inch, and the 50% height air gap height b=0.4/2=0.20 inch. From Equation 1, $AREA_{gap} = (a + w_{gap})*(b + w_{gap}) = (0.225 + 0.03)*(0.20 + 0.03)$. Here, a>>$w_{gap}$ and b>>$w_{gap}$.

The reluctance ($\mathfrak{R} = F/\phi$) of a magnetic circuit is analogous to the resistance (R) in an electrical circuit (e.g., current (I) corresponds to φ (magnetic flux) and voltage (V) corresponds to F (ampere-turns)).

Equations 2 and 3 respectively show the reluctance ($\mathfrak{R}_{gap}$) of the air gap 2 and the reluctance ($\mathfrak{R}_{steel}$) of the steel portion of the CT core 4:

$$\mathfrak{R}_{gap} = w_{gap}/\mu_0 * AREA_{gap} \quad \text{(Eq. 2)}$$

$$\mathfrak{R}_{steel} = w_{steel}/\mu_s * AREA_{steel} \quad \text{(Eq. 3)}$$

wherein:

$\mu_0 = 4*\pi*10^{-7}$;

$\mu_s \approx 2000$;

$AREA_{gap} \approx 0.5 * AREA_{steel}$ for a 50% height air gap;

$w_{steel} \approx 76 * w_{gap}$ for the example dimensions of the CT core 4;

$1/\mu_s \approx 5*10^{-4}$; and $1/\mu_0 = 7.96*10^5$.

From the above, $\mathfrak{R}_{gap} >> \mathfrak{R}_{steel}$. Since $\mathfrak{R}_{gap} = F_{gap}/\phi$ and $\mathfrak{R}_{steel} = F_{steel}/\phi$, the air gap 2 requires many more ampere-turns than the steel part of the magnetic circuit in order to saturate.

EXAMPLE 3

Figure 6:
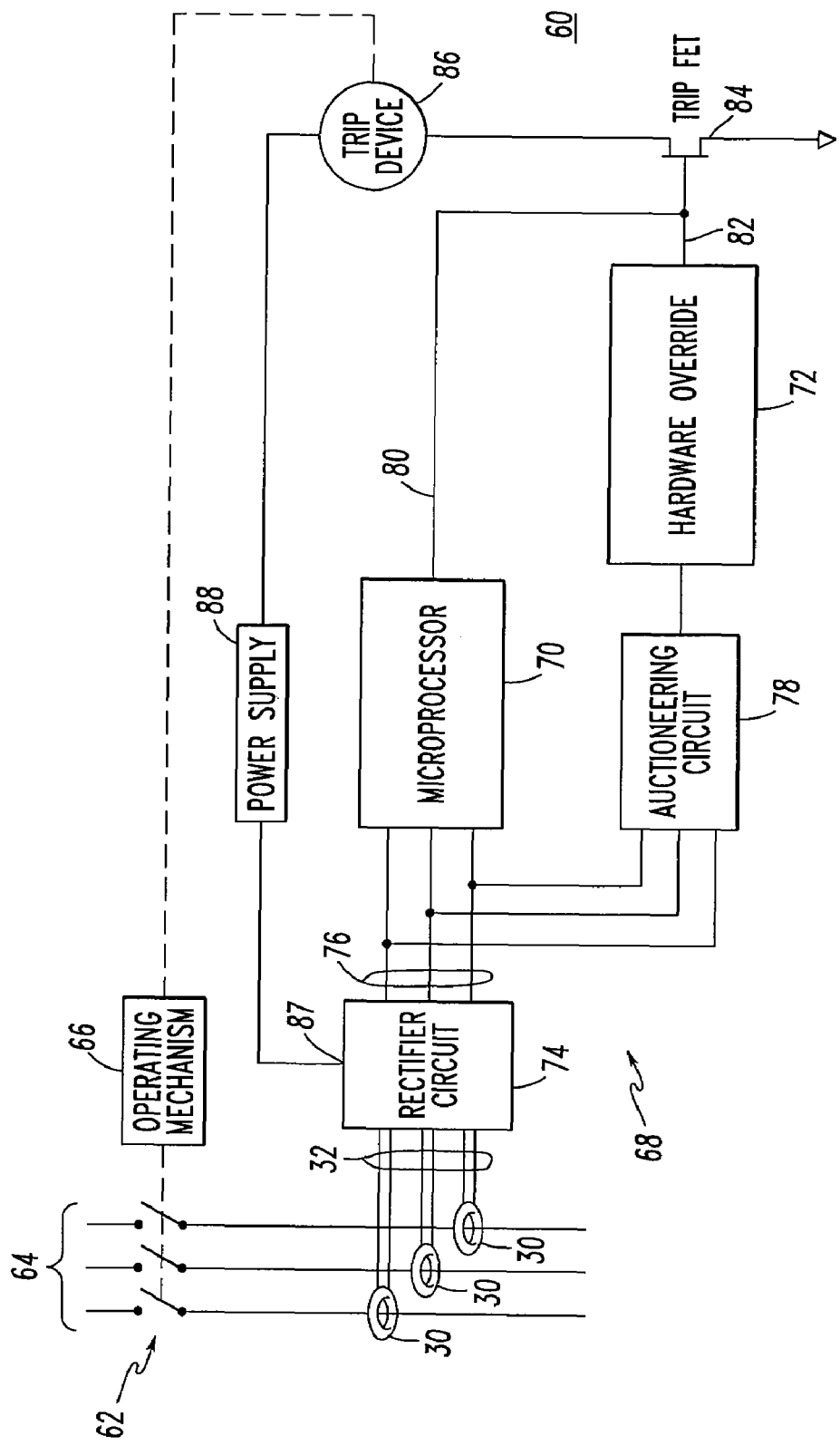
FIG. 6 is a block diagram of a circuit interrupter in accordance with another embodiment of the invention.

FIG. 6 shows a circuit interrupter, such as molded case circuit breaker 60, including a housing (not shown) in which a number of separable contacts 62 (e.g., without limitation, a pair per each phase) are contained. The separable contacts 62 are associated with conductors 64 of a power distribution system including three example phases. The separable contacts 62 may be operated automatically in response to an overcurrent condition. The separable contacts 62 may also be operated manually by way of an operating handle (not shown) disposed on the outside of the circuit breaker 60. As is conventional, the circuit breaker 60 includes an operating mechanism 66, which is structured to open and close the separable contacts 62, and a trip unit, such as trip assembly 68, which senses overcurrent conditions. Upon sensing an overcurrent condition, the trip assembly 68 actuates the operating mechanism 66 to a trip position, which moves the separable contacts 62 to their open position, as shown.

In the example embodiment, the trip assembly 68 employs both a microprocessor 70 and a hardware override circuit 72 to detect an overcurrent condition and/or to actuate the operating mechanism 66. The trip assembly 68 cooperates with a number of current sensors, such as the example current transformers 30, in order to provide to a rectifier circuit 74 currents proportional to the currents flowing in the corresponding conductors 64 and through the corresponding separable contacts 62. The three outputs 76 of the rectifier circuit 74 are provided to both the microprocessor 70 and an auctioneering circuit 78, which outputs a peak sensed current value to the hardware override circuit 72. In response to an overcurrent condition, the microprocessor 70 and/or the hardware override circuit 72 produce various trip signals 80,82 (e.g., without limitation, short delay trip; long delay trip; instantaneous trip; breakpoint trip), which are provided to a trip FET 84 that drives a trip device, such as a trip coil 86. The trip coil 86, in turn, actuates the operating mechanism 66, in order to trip open the separable contacts 62. Another output 87 of the rectifier circuit 74 supplies power from the secondary windings 32 of the current transformers 30 to a power supply 88, in order to power the trip coil 86 and the rest of the trip assembly 68.

It should be noted that the particular arrangement of components shown in FIG. 6 is a non-limiting example and that other arrangements, within the scope of the invention, are contemplated. For example, although discussed as separate components, it is contemplated that the hardware override circuit 72 and the microprocessor 70 may be implemented as a single device, such as and without limitation, an integrated circuit (not shown). Alternatively, a wide range of analog and/or digital circuits (not shown) may be employed. Furthermore, any suitable number of power lines or phases may be employed.

EXAMPLE 4

In this example, the CT core 4 is made of taped silicon steel 18 as best shown in FIG. 4. The taped silicon steel 18 is wound in a plurality of layers 90 to form the CT core 4 having dimensions that determine the suitable magnetic characteristics and the physical dimensions of the current transformer 30 of FIG. 5. In order to increase Bmax (as shown in FIG. 3), provide a relatively high ΔB, reduce remanence effects and ensure a relatively high permeability, the CT core 4 is annealed after being wound. During the winding process, the CT core 4 is plastically deformed and stressed. This stress reduces the desired magnetic characteristics thereof. The stress relief is performed by annealing the CT core 4 at a temperature of about 1450° F. to about 1550° F. for at least about one hour. A wide range of suitable atmospheric conditions (e.g., without limitation, heating in different atmospheres, such as dried nitrogen, reduces material surface oxidation; direct or indirect heat sources) may be employed, although none is as important as the annealing temperature. This annealing returns the magnetic material of the CT core 4 to a stress-free condition. The stress annealing promotes relatively high permeability at relatively high flux densities, increases ΔB, and provides a relatively higher Bmax. Furthermore, the air gapping of the CT core 4, as previously discussed, further reduces the remanence effects.

A method of manufacturing the example current transformer 30 comprises: winding a plurality of the layers 90 of an elongated length of the taped steel 18 having a reluctance and a width 19; forming the generally circular cylindrical CT core 4 having the central opening 50 (FIG. 5), the height 8, the width 10, the inner radius 22 and the outer radius 20 from the winding of the elongated length of taped steel 18; employing the height 8 of the CT core 4 corresponding to the width 19 of the elongated length of taped steel 18; employing the width 10 of the CT core 4 as being equal to the difference between the outer radius 20 and the inner radius 22; forming the air gap 2 having a reluctance, the width 6 and the depth 16 in the CT core 4; employing the depth 16 along a portion of the height 8 of the CT core 4; employing the width 6 of the air gap 2 being substantially smaller than both of the height 8 and the width 10 of the CT core 4; employing the reluctance of the air gap 2 being substantially greater than the reluctance of the taped steel 18 of the CT core 4; and after the winding, annealing the CT core 4 at a temperature of about 1450° F. to about 1550° F. for at least about one hour. The secondary winding 32 is then disposed about the novel CT core 4 in a conventional manner.

EXAMPLE 5

The following example parameters are employed by the example CT core 4: Bmax>=17 kG; ΔB>=10 kG; and permeability>=2000 N/A$^2$ (H/M) (Newtons per ampere squared; Henries per meter).

As a result of the disclosed CT core 4, relatively high magnitude fault currents can be sensed during the first AC half-cycle of the fault regardless of the polarity of the previous AC half-cycle. Therefore, relatively high fault currents can be detected and acted on much earlier by the trip unit 68. This results in faster clearing times (e.g., less than one AC half-cycle; less than one AC quarter-cycle) than are possible with known current transformers.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the claims appended and any and all equivalents thereof.

What is claimed is:

1. A current transformer comprising:
   a generally circular cylindrical current transformer core having a central opening, a height, a width, an inner radius and an outer radius; and
   a secondary winding disposed about said generally circular cylindrical current transformer core,
   wherein said generally circular cylindrical current transformer core is formed from a winding of an elongated length of taped steel having a reluctance and a width,
   wherein the height of said generally circular cylindrical current transformer core corresponds to said width of said elongated length of taped steel,
   wherein the width of said generally circular cylindrical current transformer core is equal to the difference between said outer radius and said inner radius, wherein an air gap having a reluctance, a width and a depth is disposed in said generally circular cylindrical current transformer core, wherein said depth is along a portion of the height of said generally circular cylindrical current transformer core, wherein the width of said air gap is substantially smaller than both of the height and the width of said generally circular cylindrical current transformer core, wherein the reluctance of said air gap is substantially greater than the reluctance of the taped steel of said generally circular cylindrical current transformer core, and wherein said generally circular cylindrical current transformer core is structured to have a permeability resulting from being annealed at a temperature of about 1450° F. to about 1550° F. for at least about one hour.

2. The current transformer of claim 1 wherein said current transformer has a maximum magnetic flux density of at least about 17 kG.

3. The current transformer of claim 1 wherein said current transformer has a maximum magnetic flux density, a residual or remanent magnetization, and a change in magnetic flux density value equal to said maximum magnetic flux density less said residual or remanent magnetization of at least about 10 kG.

4. The current transformer of claim 1 wherein said permeability is at least about 2000 N/A$^2$.

5. The current transformer of claim 1 wherein said current transformer has a maximum magnetic flux density of at least about 17 kG, a residual or remanent magnetization, a change in magnetic flux density value equal to said maximum magnetic flux density less said residual or remanent magnetization of at least about 10 kG, and said permeability of at least about 2000 N/A$^2$.

6. The current transformer of claim 1 wherein said taped steel comprises silicon steel.

7. A circuit interrupter comprising:
separable contacts;
an operating mechanism structured to open and close said separable contacts;
a current sensor structured to sense current flowing through said separable contacts;
a trip unit cooperating with said current sensor and said operating mechanism to trip open said separable contacts; and
a power supply cooperating with said current sensor to power said trip unit,
wherein said current sensor comprises:
a generally circular cylindrical current transformer core having a central opening, a height, a width, an inner radius and an outer radius, and
a secondary winding disposed about said generally circular cylindrical current transformer core,
wherein said generally circular cylindrical current transformer core is formed from a winding of an elongated length of taped steel having a reluctance and a width,
wherein the height of said generally circular cylindrical current transformer core corresponds to said width of said elongated length of taped steel,
wherein the width of said generally circular cylindrical current transformer core is equal to the difference between said outer radius and said inner radius,
wherein an air gap having a reluctance, a width and a depth is disposed in said generally circular cylindrical current transformer core, wherein said depth is along a portion of the height of said generally circular cylindrical current transformer core, wherein the width of said air gap is substantially smaller than both of the height and the width of said generally circular cylindrical current transformer core, wherein the reluctance of said air gap is substantially greater than the reluctance of the taped steel of said generally circular cylindrical current transformer core, and wherein said generally circular cylindrical current transformer core is structured to have a permeability resulting from being annealed at a temperature of about 1450° F. to about 1550° F. for at least about one hour.

8. The circuit interrupter of claim 7 wherein said current transformer has a maximum magnetic flux density of at least about 17 kG.

9. The circuit interrupter of claim 7 wherein said current transformer has a maximum magnetic flux density, a residual or remanent magnetization, and a change in magnetic flux density value equal to said maximum magnetic flux density less said residual or remanent magnetization of at least about 10 kG.

10. The circuit interrupter of claim 9 wherein said sensed current has both a positive half-cycle and a negative half-cycle; and wherein said change in magnetic flux density value is regardless whether said sensed current occurred on said positive half-cycle or said negative half-cycle.

11. The circuit interrupter of claim 7 wherein said permeability is at least about 2000 N/A$^2$.

12. The circuit interrupter of claim 7 wherein said current transformer has a maximum magnetic flux density of at least about 17 kG, a residual or remanent magnetization, a change in magnetic flux density value equal to said maximum magnetic flux density less said residual or remanent magnetization of at least about 10 kG, and said permeability of at least about 2000 N/A$^2$.

13. The circuit interrupter of claim 7 wherein said taped steel comprises silicon steel.

14. The circuit interrupter of claim 7 wherein said sensed current is an alternating current having a positive half-cycle and a negative half-cycle; and wherein said trip unit and said current sensor are structured to trip open said separable contacts in less than one of said positive half-cycle and said negative half-cycle.

15. A method of manufacturing a current transformer, said method comprising:
winding a plurality of layers of an elongated length of taped steel having a reluctance and a width;
forming a generally circular cylindrical current transformer core having a central opening, a height, a width, an inner radius and an outer radius from said winding of said elongated length of taped steel;
employing the height of said generally circular cylindrical current transformer core corresponding to said width of said elongated length of taped steel;
employing the width of said generally circular cylindrical current transformer core as being equal to the difference between said outer radius and said inner radius;
forming an air gap having a reluctance, a width and a depth in said generally circular cylindrical current transformer core;
employing said depth along a portion of the height of said generally circular cylindrical current transformer core;

employing the width of said air gap being substantially smaller than both of the height and the width of said generally circular cylindrical current transformer core;

employing the reluctance of said air gap being substantially greater than the reluctance of the taped steel of said generally circular cylindrical current transformer core; and after said winding, annealing said generally circular cylindrical current transformer core at a temperature of about 1450° F. to about 1550° F. for at least about one hour.

16. The method of claim 15 further comprising employing said current transformer having a maximum magnetic flux density of at least about 17 kG.

17. The method of claim 15 further comprising employing said current transformer having a maximum magnetic flux density;

employing said current transformer having a residual or remanent magnetization; and employing said current transformer having a change in magnetic flux density value equal to said maximum magnetic flux density less said residual or remanent magnetization of at least about 10 kG.

18. The method of claim 15 further comprising employing said current transformer having a permeability of at least about 2000 N/A$^2$.

19. The method of claim 15 further comprising employing said current transformer having a maximum magnetic flux density of at least about 17 kG;

employing said current transformer having a residual or remanent magnetization;

employing said current transformer having a change in magnetic flux density value equal to said maximum magnetic flux density less said residual or remanent magnetization of at least about 10 kG; and employing said current transformer having a permeability of at least about 2000 N/A$^2$.

20. The method of claim 15 further comprising increasing the permeability of said generally circular cylindrical current transformer core from said annealing.

21. The method of claim 15 further comprising employing said current transformer having a first maximum magnetic flux density prior to said annealing and a second maximum magnetic flux density after said annealing, said second maximum magnetic flux density being greater than said first maximum magnetic flux density by about 20%.

22. The method of claim 15 further comprising disposing a secondary winding about said generally circular cylindrical current transformer core.

* * * * *